United States Patent
Yoon et al.

(10) Patent No.: US 8,420,453 B2
(45) Date of Patent: Apr. 16, 2013

(54) METHOD OF FORMING ACTIVE REGION STRUCTURE

(75) Inventors: Jun-Ho Yoon, Suwon-si (KR);
Byeong-Soo Kim, Hwaseong-si (KR);
Kyoung-Sub Shin, Seongnam-si (KR);
Hong Cho, Yongin-si (KR);
Hyung-Yong Kim, Cheongju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 317 days.

(21) Appl. No.: 12/801,074

(22) Filed: May 20, 2010

(65) Prior Publication Data
US 2011/0045643 A1    Feb. 24, 2011

(30) Foreign Application Priority Data
Aug. 18, 2009    (KR) .................. 10-2009-0075968

(51) Int. Cl.
*H01L 21/82*    (2006.01)
(52) U.S. Cl.
USPC .................... 438/129; 257/E21.532
(58) Field of Classification Search .............. 436/129; 257/E21.532
See application file for complete search history.

(56) References Cited

U.S. PATENT DOCUMENTS

| | | | |
|---|---|---|---|
| 4,394,196 A | 7/1983 | Iwai | |
| 6,559,029 B2 * | 5/2003 | Hur | 438/427 |
| 2002/0190342 A1 * | 12/2002 | Hur | 257/499 |
| 2007/0026633 A1 * | 2/2007 | Lee | 438/424 |
| 2008/0157194 A1 * | 7/2008 | Lee et al. | 257/334 |
| 2009/0162989 A1 * | 6/2009 | Cho et al. | 438/427 |
| 2009/0298276 A1 * | 12/2009 | Lee et al. | 438/597 |
| 2011/0092048 A1 * | 4/2011 | Lee et al. | 438/430 |

FOREIGN PATENT DOCUMENTS

| | | |
|---|---|---|
| JP | 57-023239 A | 2/1982 |
| JP | 57-091535 A | 7/1982 |
| JP | 58-093342 A | 6/1983 |
| JP | 09-055421 A | 2/1997 |
| KR | 10-0151267 B1 | 6/1998 |

* cited by examiner

*Primary Examiner* — Robert J Hoffberg
*Assistant Examiner* — Igwe U Anya
(74) *Attorney, Agent, or Firm* — Lee & Morse, P.C.

(57) ABSTRACT

A method of forming an active region structure includes preparing a semiconductor substrate including a cell array region and a peripheral circuit region, forming preliminary cell active regions in the cell array region of the semiconductor substrate, and forming cell active regions in the preliminary cell active regions and at least one peripheral active region in the peripheral circuit region of the semiconductor substrate, such that the preliminary cell active regions, the cell active regions, and the at least one peripheral active region are integrally formed with the semiconductor substrate and protrude from the semiconductor substrate.

9 Claims, 7 Drawing Sheets

METHOD OF FORMING ACTIVE REGION STRUCTURE

BACKGROUND

1. Field

Example embodiments relate to a method of forming an active region structure.

2. Description of Related Art

In general, semiconductor etching and photolithography processes involve transferring mask patterns of a photomask onto a semiconductor substrate using photolithography and etching apparatuses. To do this, the photoresist apparatus may form aerial images of the mask patterns on a photoresist layer of the semiconductor substrate. The semiconductor photolithography process may be performed to form photoresist patterns corresponding to the aerial images on the semiconductor substrate. The etching apparatus may transfer the photoresist patterns onto or into the semiconductor substrate using an etchant. The semiconductor etching process may be performed to form structures on or in the semiconductor substrate using the photoresist patterns.

In this case, as a semiconductor device design rule becomes smaller, a quality of the images formed by the photolithography apparatus on the photoresist layer may be reduced. This is because the images of the photolithography apparatus may be affected by interference of light beams crossing the mask patterns through the reduction in the design rule of the semiconductor devices. In addition, a quality of structures formed by the etching apparatus on or in the semiconductor substrate according to the photoresist patterns may be reduced. This is because the structures may be etched at different rates from one another by depending on the exposed areas of the upper portion of the semiconductor substrate.

SUMMARY

Embodiments are therefore directed to a method of forming an active region structure, which substantially overcomes one or more of the problems due to the limitations and disadvantages of the related art.

Embodiments provide a method of forming an active region structure, which minimizes light interference during a semiconductor photolithography process.

Embodiments provide a method of forming an active region structure, which allows etch rates of an etchant to be substantially the same during an etching process on an entire surface of a semiconductor substrate.

Embodiments provide a method of forming an active region structure, which minimizes an exposed area of an upper portion of a semiconductor substrate during performance of at least one semiconductor photolithography process.

At least one of embodiments may be realized by providing a method of forming an active region structure, including preparing a semiconductor substrate. The semiconductor substrate includes a cell array region and a peripheral circuit region. Preliminary cell active regions are formed in the cell array region of the semiconductor substrate. Cell active regions are formed in the preliminary cell active regions, and at least one peripheral active region is formed in the peripheral circuit region of the semiconductor substrate. The preliminary cell active regions, the active regions, and the at least one peripheral active region are integrally formed with the semiconductor substrate and protrude from the semiconductor substrate.

The formation of the preliminary cell active regions may include forming a pad layer to cover an entire surface of the semiconductor substrate. First buffer patterns and a buffer layer may be formed on the pad layer in the cell array region and the peripheral circuit region of the semiconductor substrate, respectively. Sacrificial patterns may be formed between the first buffer patterns. Second buffer patterns may be formed in the sacrificial patterns, respectively. The first and second buffer patterns may have a line shape and correspond to the preliminary cell active regions. First cell trenches may be formed in the cell array region of the semiconductor substrate to correspond to the sacrificial patterns.

The formation of the first cell trenches may include etching the sacrificial patterns and the pad layer disposed under the sacrificial patterns using the first and second buffer patterns and the buffer layer as an etch mask to expose the semiconductor substrate. The pad layer may be divided into cell pad patterns in the cell array region. The first and second buffer patterns, the buffer layer, and the semiconductor substrate may be etched using the cell pad patterns of the cell array region and the pad layer of the peripheral circuit region as an etch mask. The first and second buffer patterns and the buffer layer may be removed from the cell pad patterns and the pad layer.

The formation of the cell active regions and the at least one peripheral active region may include forming a cell definition pattern and a peripheral definition pattern on the cell pad patterns of the cell array region and the pad layer of the peripheral circuit region, respectively, to fill the first cell trenches. The cell definition pattern may have isolation holes formed on the cell pad patterns. The peripheral definition pattern may define the at least one peripheral active region. The cell pad patterns disposed within the isolation holes and the pad layer disposed adjacent to the peripheral definition pattern may be etched using the cell definition pattern and the peripheral definition pattern as an etch mask. The pad layer of the peripheral circuit region may be patterned to form at least one peripheral pad pattern. The preliminary active regions disposed within the isolation holes and the semiconductor substrate disposed adjacent to the peripheral definition pattern may be etched using the cell definition pattern, the peripheral definition pattern, and the at least one peripheral pad pattern as an etch mask. Thus, second cell trenches may be formed in the cell array region, and peripheral trenches may be formed in the peripheral circuit region. The cell definition pattern and the peripheral definition pattern may be removed from the semiconductor substrate.

The first and second cell trenches may define the cell active regions under the cell pad patterns of the cell array region. The first and second cell trenches may extend to substantially the same depth from a top surface to a bottom surface of the semiconductor substrate. The peripheral trenches may define the at least one peripheral active region under the at least one peripheral pad pattern of the peripheral circuit region. The peripheral trenches may be formed to substantially the same depth as the first and second cell trenches.

Each of the second cell trenches may be formed between selected cell active regions disposed opposite each other on both sides of one selected isolation hole in a widthwise direction of the first and second buffer patterns. A width of each of the first cell trenches may be smaller than a width of each of the second cell trenches in the widthwise direction of the first and second buffer patterns.

Two adjacent first cell trenches may overlap one selected second cell trench. The width of each of the first cell trenches may be substantially the same as or different from a width of each of the isolation holes in the widthwise direction of the first and second buffer patterns. Each of the isolation holes may be defined by an opening area of the one selected second cell trench.

The cell and peripheral definition patterns may be formed of carbon (C), a C-containing single material, or a C-containing stacked material.

The formation of the preliminary cell active regions may include forming a pad layer to cover an entire surface of the semiconductor substrate. First cell pad patterns may be formed on the cell array region of the semiconductor substrate. The first cell pad patterns may have a line shape. The first cell pad patterns may be divided into second cell pad patterns. The second cell pad patterns may have a line shape and correspond to the preliminary cell active regions. The semiconductor substrate of the cell array region may be etched using the second cell pad patterns and the pad layer of the peripheral circuit region as an etch mask, thereby forming first cell trenches in the semiconductor substrate. The second cell pad patterns and the pad layer of the peripheral circuit region may be partially etched.

The formation of the cell active regions and the at least one peripheral active region may include forming a cell definition pattern on the second cell pad patterns in the cell array region, and a peripheral definition pattern on the pad layer in the peripheral circuit region. The cell definition pattern and the peripheral definition pattern may fill the first cell trenches. The cell definition pattern may have isolation holes formed on the second cell pad patterns. The peripheral definition pattern may define the at least one peripheral active region. The second cell pad patterns disposed in the isolation holes and the pad layer disposed adjacent to the peripheral definition pattern may be etched using the cell definition pattern and the peripheral definition pattern as an etch mask. The pad layer of the peripheral circuit region may be patterned to form at least one peripheral pad pattern. The preliminary active regions disposed in the isolation holes and the semiconductor substrate disposed adjacent to the peripheral definition pattern may be etched using the cell definition pattern, the peripheral definition pattern, and the at least one peripheral pad pattern as an etch mask. Thus, second cell trenches may be formed in the cell array region, and peripheral trenches may be formed in the peripheral circuit region. The cell definition pattern and the peripheral definition pattern may be removed from the semiconductor substrate.

At least one of embodiments may also be realized by providing a method of forming an active region structure, including preparing a semiconductor substrate. The semiconductor substrate includes a cell array region and a peripheral circuit region. Preliminary cell active regions are formed in the cell array region of the semiconductor substrate. First cell trenches are formed in predetermined regions of the cell array region of the semiconductor substrate. Each of the preliminary cell active regions is disposed among four adjacent ones of the first cell trenches. Two selected from the four adjacent first cell trenches are disposed on an extension line crossing between the remaining two of the four adjacent first cell trenches. Cell active regions are formed in the preliminary cell active regions and simultaneously, at least one peripheral active region is formed in the peripheral circuit region of the semiconductor substrate. The preliminary cell active regions, the active regions, and the at least one peripheral active region may be integrally formed with the semiconductor substrate and protrude from the semiconductor substrate.

The formation of the preliminary cell active regions may include forming a pad layer to cover an entire surface of the semiconductor substrate. Openings may be formed in predetermined regions of the pad layer of the cell array region. The openings may be aligned with the first cell trenches to expose the semiconductor substrate. The semiconductor substrate disposed in the openings may be etched using the pad layer of the cell array region and the peripheral circuit region as an etch mask. Thus, the first cell trenches may be formed in the semiconductor substrate.

The formation of the cell active regions and the at least one peripheral active region may include forming cell definition patterns on the pad layer of the cell array region, and a peripheral definition pattern on the pad layer of the peripheral circuit region. The cell definition patterns and the peripheral definition pattern may fill the first cell trenches. Spaces between the cell definition patterns may constitute isolation holes exposing the pad layer of the cell array region. The peripheral definition pattern may define the at least one peripheral active region. The pad layer disposed in the isolation holes and the pad layer disposed adjacent to the peripheral definition pattern may be etched using the cell definition patterns and the peripheral definition pattern as an etch mask. Thus, cell pad patterns may be formed in the cell array region, and at least one peripheral pad pattern may be formed in the peripheral circuit region. The preliminary active regions disposed in the isolation holes and the semiconductor substrate disposed adjacent to the peripheral definition pattern may be etched using the cell definition patterns, the cell pad patterns, the peripheral definition pattern, and the at least one peripheral pad pattern as an etch mask. Thus, second cell trenches may be formed in the cell array region, and peripheral trenches may be formed in the peripheral circuit region. The cell definition patterns and the peripheral definition pattern may be removed from the semiconductor substrate.

The first and second cell trenches may define the cell active regions under the cell pad patterns of the cell array region. The first and second cell trenches may extend to substantially the same depth from top surface to bottom surface of the semiconductor substrate. The peripheral trenches may define the at least one peripheral active region under the at least one peripheral pad pattern of the peripheral circuit region. The peripheral trenches may be formed to substantially the same depth as the first and second cell trenches.

The cell pad patterns may have a line shape. Each of the second cell trenches may be formed under one selected isolation hole between two adjacent cell active regions. A width of each of the first cell trenches may be greater than a width of each of the second cell trenches in a widthwise direction of the cell pad patterns.

Two adjacent second cell trenches may overlap one selected first cell trench. The width of each of the second cell trenches may be substantially the same as or different from a width of each of the isolation holes in the widthwise direction of the cell pad patterns.

Each of the isolation holes may cross an upper portion of one selected from the second cell trench, and the isolation holes may be formed in the cell definition patterns to be parallel to one another.

The cell and peripheral definition patterns may be formed of C, a C-containing single material, or a C-containing stacked material.

BRIEF DESCRIPTION OF THE DRAWINGS

Embodiments will become more apparent to those of ordinary skill in the art by describing in detail with reference to the attached drawings, in which.

DETAILED DESCRIPTION

Figure 1:
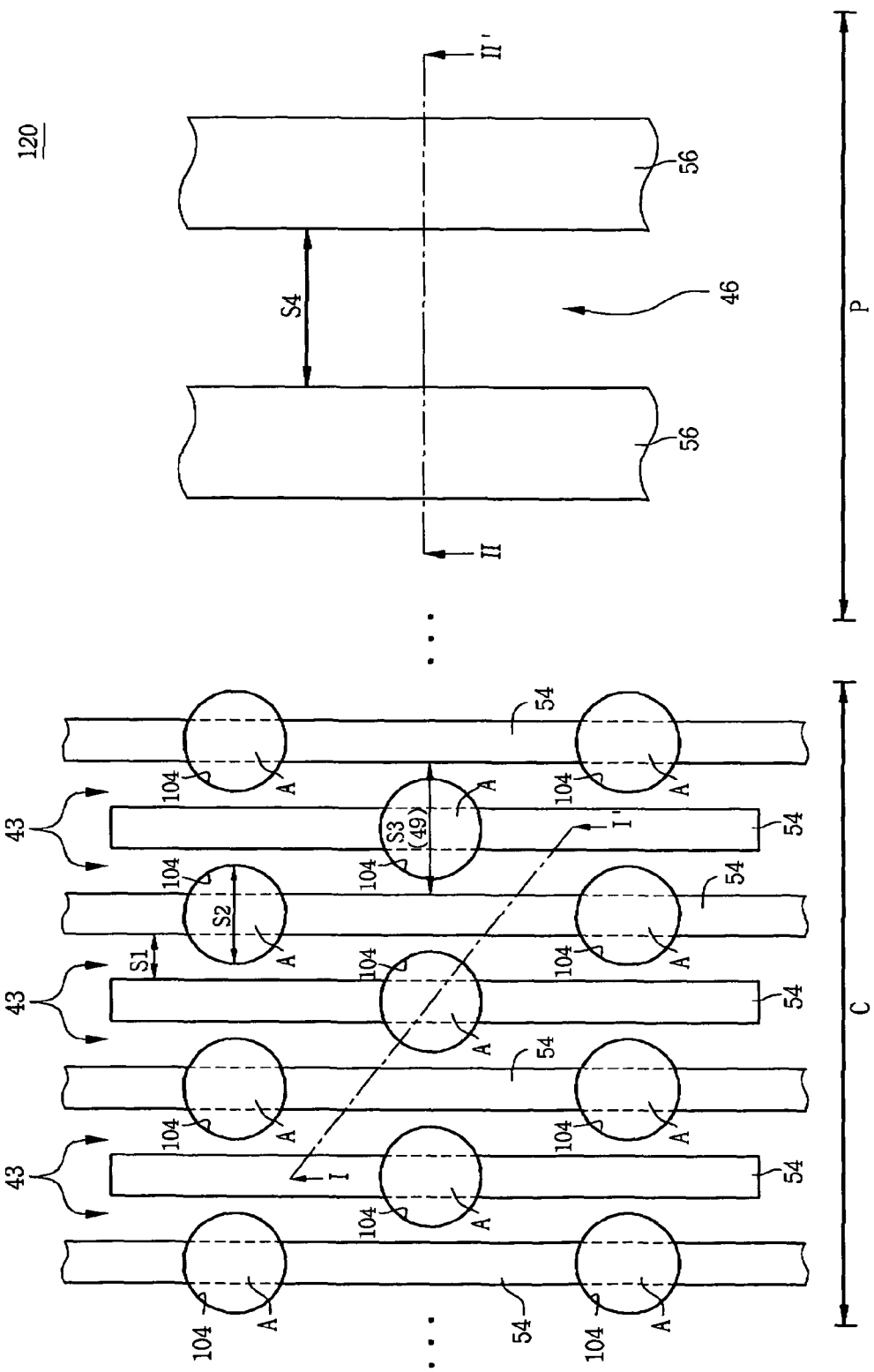
FIG. 1 illustrates a plan view of an active region structure according to example embodiments.

Korean Patent Application No. 10-2009-0075968, filed on Aug. 18, 2009, in the Korean Intellectual Property Office, and entitled: "Method of Forming Active Region Structure," is incorporated by reference herein in its entirety.

Various example embodiments will now be described more fully with reference to the accompanying drawings in which some example embodiments are shown. Example embodiments may, however, be embodied in different forms and should not be construed as limited to the embodiments set forth herein. Rather, these embodiments are provided so that this disclosure is thorough and complete and fully conveys the scope of the inventive concept to one skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will also be understood that, although the terms "preliminary active region," "cell active region," "peripheral active region," "through hole," "isolation hole," "opening," etc. may be used herein to describe various elements, components, regions, layers and/or sections, these elements, components, regions, layers and/or sections should not be limited by these terms. These terms are only used to distinguish one element, component, region, layer or section from another region, layer or section. As used herein, the term "at least one (or two)" includes any and all combinations of one or more of the associated listed items. Spatially relative terms, such as "under", "selected", "remaining", "adjacent to", "on" and the like, may be used herein for ease of description to describe one element or feature's relationship to another element(s) or feature(s) as illustrated in the figures. The terminology used herein is for the purpose of describing particular embodiments only and is not intended to limit the inventive concept.

Hereinafter, a method of forming an active region structure according to example embodiments will be described in more detail with reference to FIGS. 1 through 13.

FIG. 1 illustrates a plan view of an active region structure according to example embodiments.

Referring to FIG. 1, an active region structure 120 may include a cell array region C and a peripheral circuit region P. The cell array region C may include cell active regions 54 and isolation regions A along rows and columns. The cell active regions 54 and the isolation regions A may be disposed parallel to one another along the rows or columns. The cell active regions 54 and the isolation regions A may constitute preliminary active regions along the rows or columns. The preliminary active regions may be spaced a predetermined distance S1 apart from one another in the cell array region C. The preliminary active regions may be divided by isolation holes 104 to be formed in the cell active regions 54 along rows or columns. The isolation holes 104 may have a diameter S2 therein. In this case, the isolation regions A disposed within the isolation holes 104 may be removed from the preliminary active regions. Thus, a cell active region 54 may be defined by a first cell trench 43 having a predetermined width S1 along a row or a column and a second cell trench 49 having a predetermined width S3 along a column or a row. The peripheral circuit region P may have peripheral active regions 56. Also, the peripheral active regions 56 may be defined by peripheral trenches 46 having a predetermined width S4.

FIGS. 2 through 13 illustrate cross-sectional views taken along lines I-I' and II-II' of FIG. 1, which illustrate a method of forming an active region structure according to example embodiments.

Figure 2:
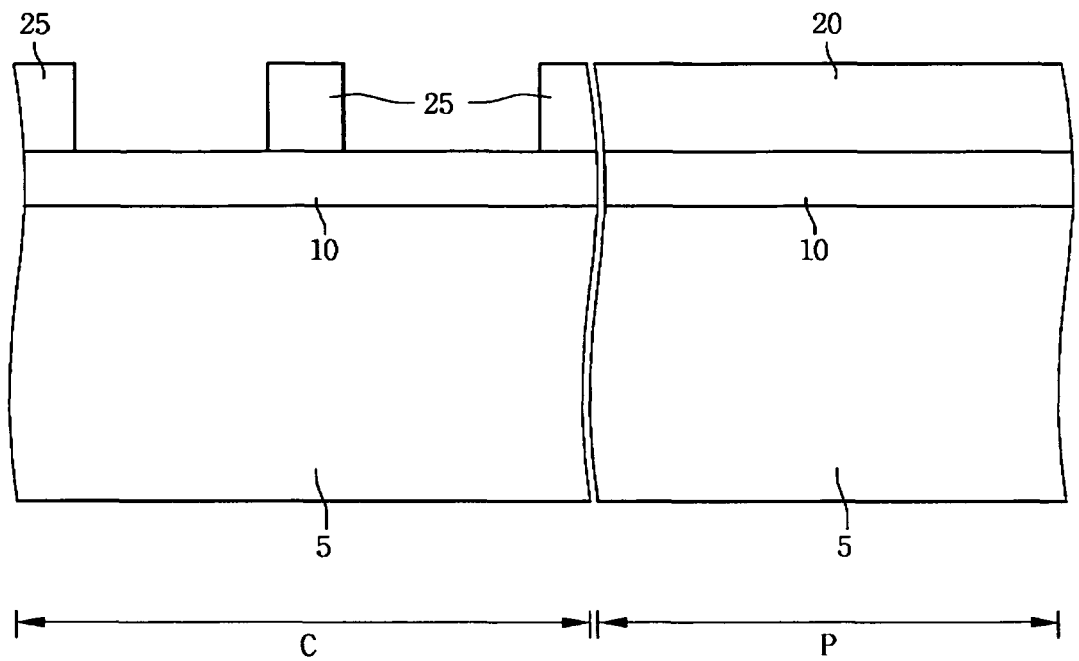
FIGS. 2 through 13 illustrate cross-sectional views taken along lines I-I' and II-II' of FIG. 1, which illustrate a method of forming an active region structure according to example embodiments.
Figure 3:
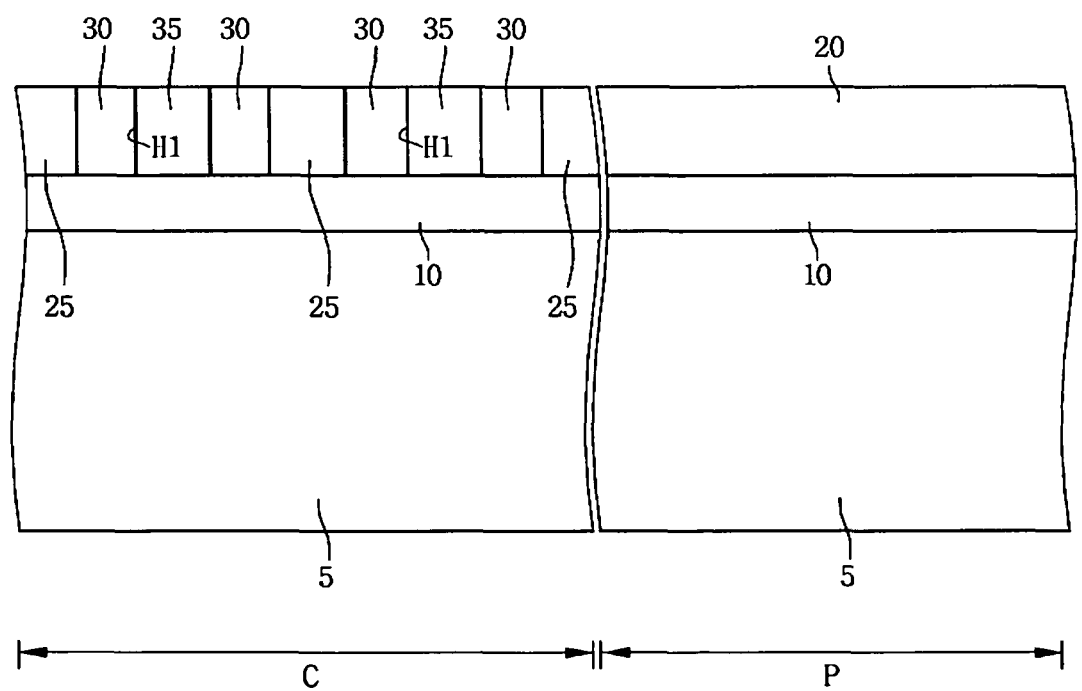
Figure 4:
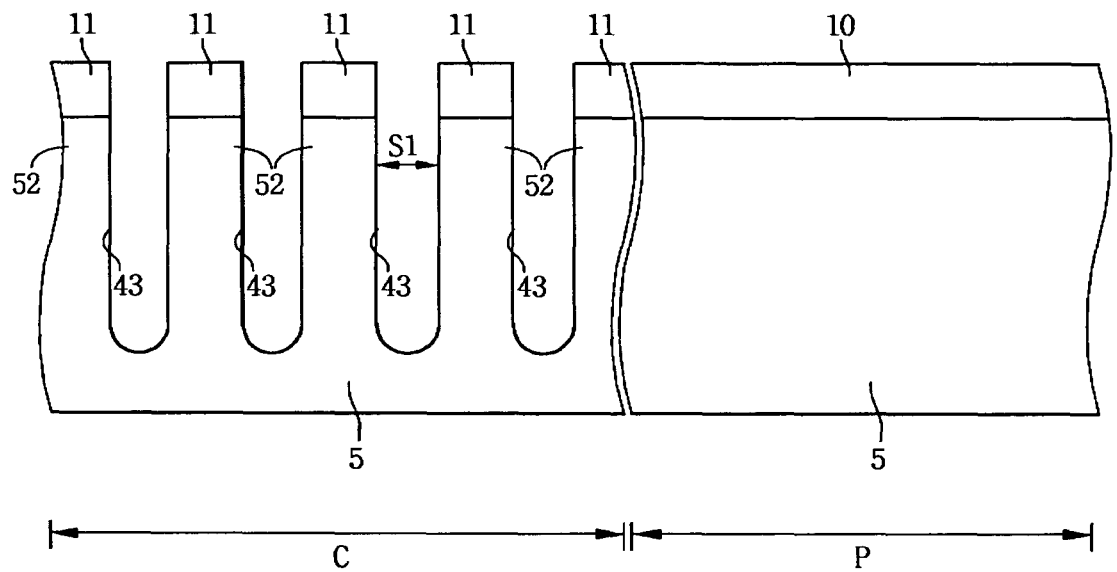

FIGS. 2 through 4 illustrate cross-sectional views taken along lines I-I' and II-II' of FIG. 1, which illustrate an initial step of a method of forming an active region structure according to a first example embodiment.

Referring to FIG. 2, a semiconductor substrate 5 may be prepared. The semiconductor substrate 5 may have a cell array region C and a peripheral circuit region P. A pad layer 10 and a buffer layer 20 may be sequentially formed on the semiconductor substrate 5. The pad layer 10 may include a single material or a stacked material. The pad layer 10 may include a material having a different etch rate from the buffer layer 20. A semiconductor photolithography process may be performed on the buffer layer 20.

The semiconductor photolithography process may include a coating step, an exposure step, and a development step. During the performance of the semiconductor photolithography process, photoresist patterns may be formed on the buffer layer 20 in the cell array region C, while a photoresist layer may be formed on the buffer layer 20 in the peripheral circuit region P. During the performance of the semiconductor photolithography process, the photoresist patterns of the cell array region C and the photoresist layer of the peripheral circuit region P may or may not be formed simultaneously.

When the photoresist patterns and the photoresist layer are not formed simultaneously, an unselected cell array region C or a peripheral circuit region P may be completely covered with a protection layer, e.g., a selected photoresist layer, through the semiconductor photolithography process. The photoresist patterns may expose portions of the buffer layer 20 as substantially equal areas in the cell array region C. The photoresist patterns may have a line shape. A semiconductor etching process may be performed on the buffer layer 20 in the cell array region C using the photoresist patterns and the photoresist layer as an etch mask.

During the performance of the semiconductor etching process, portions of the buffer layer 20 interposed between the photoresist patterns in the cell array region C may be etched at a substantially same rate using an etchant, thereby forming first buffer patterns 25. After forming the first buffer patterns 25, the photoresist patterns and the photoresist layer may be removed from the semiconductor substrate 5.

Referring to FIG. 3, sacrificial patterns 30 may be formed on the pad layer 10 between the first buffer patterns 25, e.g., completely fill spaces between adjacent first buffer patterns 25. The sacrificial patterns 30 may include a material having the same etch rate as or a different etch rate from the pad layer 10. The sacrificial patterns 30 may be formed to expose the first buffer patterns 25. A semiconductor photolithography process may be performed on the buffer layer 20, the first buffer patterns 25, and the sacrificial patterns 30. Photoresist patterns may be formed on the first buffer patterns 25 and the sacrificial patterns 30 during the performance of the semiconductor photolithography process.

The photoresist patterns may expose the sacrificial patterns 30 as substantially equal areas. The photoresist patterns may have a line shape. A photoresist layer may be formed on the buffer layer 20 during the semiconductor photolithography process. During the performance of the performance of the semiconductor photolithography process, the photoresist patterns of the cell array region C and the photoresist layer of the peripheral circuit region P may or may not be formed simultaneously. When the photoresist patterns and the photoresist layer are not formed simultaneously, an unselected cell array region C or a peripheral circuit region P may be completely covered with a protection layer, e.g., a selected photoresist layer, during the performance of the semiconductor photolithography process.

A semiconductor etching process may be performed on the sacrificial patterns 30 in the cell array region C using the photoresist patterns and the photoresist layer as an etch mask. During the performance of the semiconductor etching process, portions of the sacrificial patterns 30 interposed between the photoresist patterns may be etched at a substantially same rate using an etchant, thereby forming openings H1 in the sacrificial patterns 30. After forming the openings H1, the photoresist patterns and the photoresist layer may be removed from the semiconductor substrate 5. Subsequently, second buffer patterns 35 may be formed to fill the openings H1. The second buffer patterns 35 may include a material having the same etch rate as or a different etch rate from the first buffer patterns 25.

Referring to FIG. 4, a semiconductor etching process may be performed on the sacrificial patterns 30 and the pad layer 10 disposed under the sacrificial patterns 30, using the buffer layer 20 and the first and second buffer patterns 25 and 35 of FIG. 3 as an etch mask. That is, remaining portions of the sacrificial patterns 30 and corresponding underlying portions of the pad layer 10 may be removed to expose the substrate 5. During the performance of the semiconductor etching process, the sacrificial patterns 30 and the pad layer 10 disposed under the sacrificial patterns 30 may be etched using an etchant. During the performance of the semiconductor etching process, remaining portions of the pad layer 10 in the cell array region C may define cell pad patterns 11. The cell pad patterns 11 may expose the semiconductor substrate 5.

The semiconductor etching process may be continuously performed on the buffer layer 20, the first and second buffer patterns 25 and 35, and the semiconductor substrate 5, using the cell pad patterns 11 of the cell array region C and the pad layer 10 of the peripheral circuit region P as an etch mask. In this case, the buffer layer 20, the first and second buffer patterns 25 and 35, and the semiconductor substrate 5 may be etched using an etchant during the performance of the semiconductor etching process. First cell trenches 43 may be formed in the semiconductor substrate 5 between the cell pad patterns 11 during the performance of the semiconductor etching process. The first cell trenches 43 may have a predetermined width S1, and may define preliminary cell active regions 52 in the semiconductor substrate 5 under respective cell pad patterns 11. In other words, the preliminary cell active regions 52 may be integral with the substrate 5, and may protrude upward with the first cell trenches 43 therebetween, i.e., width S1 therebetween.

During the semiconductor etching process, the buffer layer 20 and the first and second buffer patterns 25 and 35 may be removed from the cell pad patterns 11 and the pad layer 10. The etchant corresponding to the pad layer 10 may include the same material as or a different material from the etchant corresponding to the semiconductor substrate 5, the buffer layer 20, and the first and second patterns 25 and 35.

Figure 5:
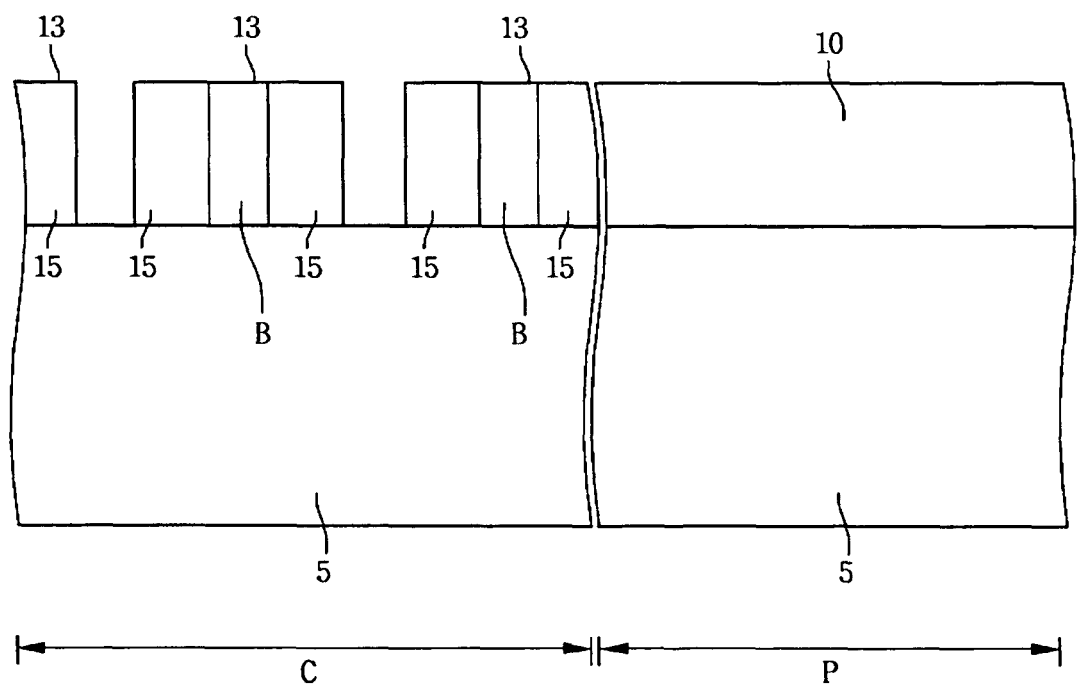
Figure 6:
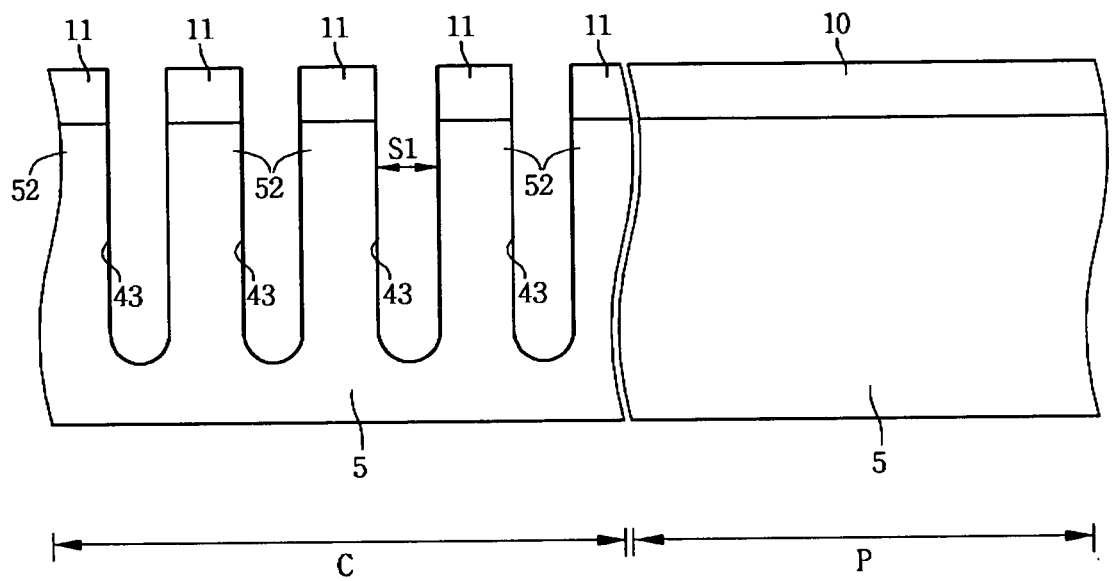

FIGS. 5 and 6 illustrate cross-sectional views taken along lines I-I' and II-II' of FIG. 1, which illustrate an initial step of a method of forming an active region structure according to a second example embodiment.

Referring to FIG. 5, the semiconductor substrate 5 may be prepared. The semiconductor substrate 5 may include the cell array region C and the peripheral circuit region P. The pad layer 10 may be formed on the semiconductor substrate 5. The pad layer 10 may include a single material or a stacked material. The pad layer 10 may include a material having a different etch rate from the semiconductor substrate 5. A semiconductor photolithography process may be performed on the pad layer 10. The semiconductor photolithography process may include a coating step, an exposure step, and a development step.

During the performance of the semiconductor photolithography process, photoresist patterns may be formed on the pad layer 10 in the cell array region C. During the performance of the semiconductor photolithography process, a photoresist layer may be formed on the pad layer 10 in the peripheral circuit region P. During the performance of the semiconductor photolithography process, the photoresist patterns of the cell array region C and the photoresist layer of the peripheral circuit region P may or may not be formed simultaneously. When the photoresist patterns and the photoresist layer are not formed simultaneously, an unselected cell array region C or a peripheral circuit region P may be completely covered with a protection layer, e.g., a selected photoresist layer, during the performance of the semiconductor photolithography process.

The photoresist patterns may expose the pad layer 10 as substantially equal areas in the cell array region C. The photoresist patterns may have a line shape. A semiconductor etching process may be performed on the pad layer 10 in the cell array region C using the photoresist patterns and the photoresist layer as an etch mask. During the performance of the semiconductor etching process, the pad layer 10 interposed between the photoresist patterns may be etched at the same rate using an etchant, thereby forming first cell pad patterns 13. After forming the first pad patterns 13, the photoresist patterns and the photoresist layer may be removed from the semiconductor substrate 5.

Subsequently, a semiconductor photolithography process may be performed on the semiconductor substrate 5 and the first cell pad patterns 13. During the performance of the semiconductor photolithography process, photoresist patterns may be formed on the semiconductor substrate 5 and the first cell pad patterns 13. The photoresist patterns may expose the first cell pad patterns 13 as substantially equal areas, which correspond a cell-pad etching region B, respectively. The photoresist patterns may have a line shape. During the performance of the semiconductor photolithography process, a photoresist layer may be formed on the pad layer 10.

During the performance of the semiconductor photolithography process, the photoresist patterns of the cell array region C and the photoresist layer of the peripheral circuit region P may or may not be formed simultaneously. When the photoresist patterns and the photoresist layer are not formed simultaneously, an unselected cell array region C or a peripheral circuit region P may be completely covered with a protection layer, e.g., a selected photoresist layer, during the performance of the semiconductor photolithography process. A semiconductor etching process may be performed on the first cell pad patterns 13 in the cell array region C using the photoresist patterns and the photoresist layer as an etch mask.

During the performance of the semiconductor etching process, the cell-pad etching regions B denoted in the first cell pad patterns 13 may be etched at the same rate using an etchant between the photoresist patterns, thereby forming second cell pad patterns 15. The second cell pad patterns 15 may expose the semiconductor substrate 5. After forming the second cell pad patterns 15, the photoresist patterns and the photoresist layer may be removed from the semiconductor substrate 5. The etchant corresponding to the second cell pad patterns 15 may include the same material as or a different material from the etchant corresponding to the first cell pad patterns 13.

Referring to FIG. 6, a semiconductor etching process may be performed on the semiconductor substrate 5 using the pad layer 10 and the second cell pad patterns 15 of FIG. 5 as an etch mask. The semiconductor substrate 5 may be etched using an etchant during the performance of the semiconductor etching process. The first cell trenches 43 may be formed in the semiconductor substrate 5 during the performance of the semiconductor etching process. The first cell trenches 43 may have the predetermined width S1, and may define the preliminary cell active regions 52. Also, during the performance of the semiconductor etching process, the second cell pad patterns 15 of the cell array region C may be partially etched, thereby forming the cell pad patterns 11 of FIG. 4. Furthermore, the pad layer 10 of the peripheral circuit region P may be partially etched during the performance of the semiconductor etching process.

Figure 7:
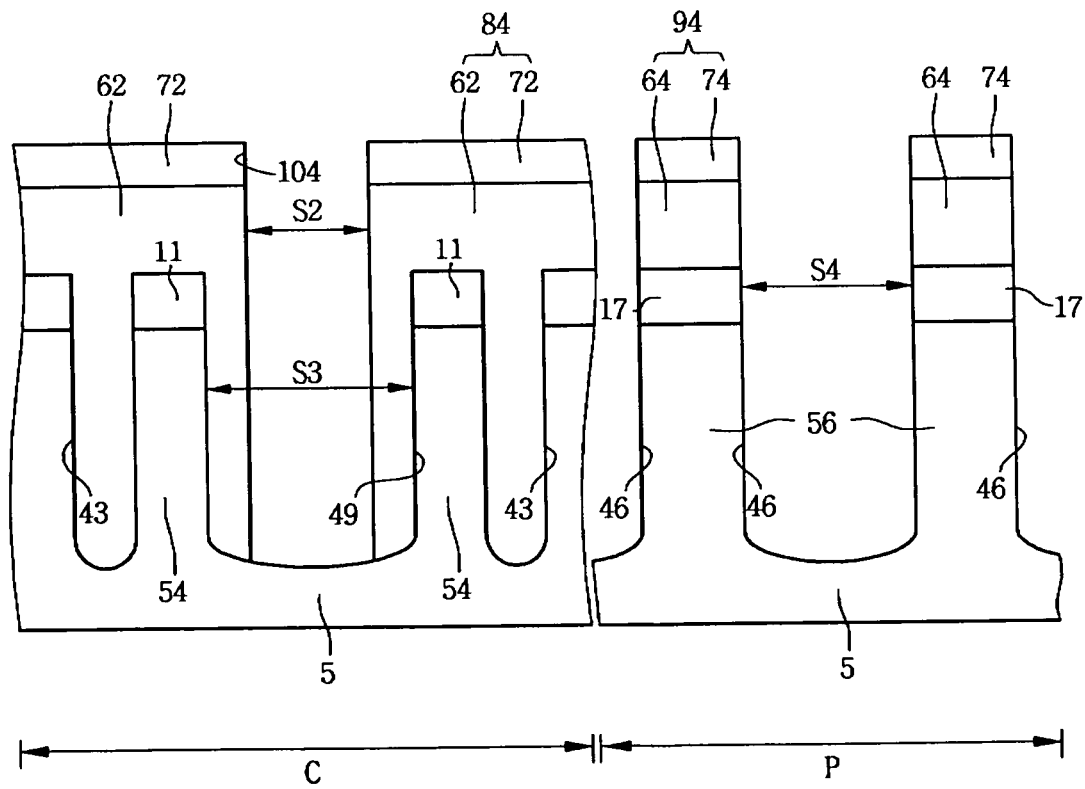

FIG. 7 illustrates a cross-sectional view taken along lines I-I' and II-II' of FIG. 1, which illustrate an intermediate step of a method of forming an active region structure according to example embodiments. It is noted that the stage illustrated in FIG. 7 may follow either the stage illustrated in FIG. 4 or the stage illustrated in FIG. 6.

Referring to FIG. 7, a lower definition layer (not shown) and an upper definition layer (not shown) may be sequentially formed in the cell array region C and the peripheral circuit region P of FIGS. 4 and 6. The lower definition layer or upper definition layer may be formed of carbon (C), a C-containing single material, and/or a C-containing stacked material. The lower definition layer may be formed on the cell pad patterns 11 and the pad layer 10 to fill the first cell trenches 43 of FIGS. 4 and 6.

A semiconductor photolithography process may be performed on the upper definition layer. In this case, the upper definition layer may prevent diffused reflection of light during the performance of the semiconductor photolithography process. A photoresist layer may be formed on the upper definition layer in the cell array region C during the performance of the semiconductor photolithography process. The photoresist layer of the cell array region C may have through holes. The through holes may correspond to the isolation holes 104 of FIG. 1, respectively. Photoresist patterns may be formed on the upper definition layer in the peripheral circuit region P during the performance of the semiconductor photolithography process.

The photoresist patterns of the peripheral circuit region P may correspond to the peripheral active regions 56 of FIG. 1. During the performance of the semiconductor photolithography process, the photoresist layer of the cell array region C and the photoresist patterns of the peripheral circuit region P may or may not be formed simultaneously. When the photoresist layer and the photoresist patterns are not formed simultaneously, an unselected cell array region C or a peripheral circuit region P may be completely covered with a protection layer, e.g., a selected photoresist layer, during the performance of the semiconductor photolithography process.

The photoresist layer of the cell array region C and the photoresist patterns of the peripheral circuit region P may be formed to expose the upper definition layer. A semiconductor etching process may be performed on the lower and upper definition layers using the photoresist layer and the photoresist patterns as an etch mask. During the performance of the semiconductor etching process, the lower and upper definition layers disposed within the through holes of the photoresist layer in the cell array region C may be etched using an etchant, thereby forming isolation holes 104, e.g., on the cell pad patterns 11. The isolation holes 104 may correspond to the through holes, respectively.

The isolation holes 104 may have a predetermined diameter S2. The isolation holes 104 may expose some of the cell pad patterns 11. The lower and upper definition layers may be patterned using the isolation holes 104 to form lower definition cell patterns 62 and upper definition cell patterns 72, respectively. A lower definition cell pattern 62 with an upper definition cell pattern 72 may define a cell definition pattern 84. During the performance of the semiconductor etching process, the cell pad patterns 11 exposed by the isolation holes 104 and the preliminary cell active regions 52 disposed within the isolation holes 104 may be etched using an etchant, i.e., removed, thereby forming second cell trenches 49. It is noted that while some of the cell pad patterns 11 are removed, i.e., the cell pad patterns 11 exposed by the isolation holes 104, other cell pad patterns 11, i.e., cell pad patterns 11 covered by the lower and upper definition cell patterns 62 and 72, may remain.

Each of the second cell trenches 49 may have a predetermined width S3. The first and second cell trenches 43 and 49 may define cell active regions 54 under the cell pad patterns 11 in the cell array region C. The first and second cell trenches 43 and 49 may extend to substantially the same depth from a top surface of the semiconductor substrate 5 toward a lower portion thereof. As such, the cell active regions 54 may be integral with the substrate 5, and may protrude upward with the first and second cell trenches 43 and 49 therebetween. The etchant corresponding to the lower and upper definition layers may include the same material as or a different material from the etchant corresponding to the cell pad patterns 11 and the preliminary cell active regions 52.

Each of the second cell trenches 49 may be formed between selected cell active regions 52 disposed opposite each other on both lateral portions of one selected isolation hole 104 in a widthwise direction of the cell active regions 52. Each of the first cell trenches 43 may have a smaller width S1 than the width S3 of each of the second cell trenches 49 in the widthwise direction of the cell active regions 52. For example, as illustrated in FIG. 1, one second cell trench 49 may overlap two adjacent first cell trenches 43. The width S1 of each of the first cell trenches 43 may be different from or substantially the same as the width of each of the isolation holes 104 in the widthwise direction of the cell active regions 52.

Each of the isolation holes 104 may be defined by the opening area of one selected second cell trench 49. Meanwhile, a semiconductor etching process may be performed on the peripheral circuit region P. During the performance of the semiconductor etching process, the lower and upper definition layers disposed adjacent to the photoresist patterns of the peripheral circuit region P, and the pad layer 10 may be etched using an etchant until the semiconductor substrate 5 is exposed. As a result, the lower and upper definition layers may be patterned to form lower definition peripheral patterns 64 and upper definition peripheral patterns 74, respectively.

The lower definition peripheral patterns 64 and the upper definition peripheral patterns 74 may define peripheral definition patterns 94. During the performance of the semiconductor etching process, the pad layer 10 of the peripheral circuit region P may be patterned to form peripheral pad patterns 17. During the performance of the semiconductor etching process, the photoresist layer and the photoresist patterns may be removed from the cell array region C and/or the peripheral circuit region P along with the lower and upper definition layers disposed within the through holes. Subsequently, the semiconductor etching process may be performed on the preliminary cell active regions 52 disposed within the isolation holes 104, and the semiconductor substrate 5 disposed adjacent to the peripheral pad patterns 17, using the peripheral definition patterns 94 and the peripheral pad patterns 17 as an etch mask.

During the performance of the semiconductor etching process, the semiconductor substrate 5 disposed adjacent to the peripheral pad patterns 17 may be etched, thereby forming peripheral trenches 46 in the peripheral circuit region P. Each of the peripheral trenches 46 may have a predetermined width S4. The peripheral trenches 46 may define the peripheral active regions 56 under the peripheral pad patterns 17 in the peripheral circuit region P. The peripheral active regions 56 may be integral with the substrate 5, and may protrude upward with the peripheral trenches 46 therebetween. The peripheral trenches 46 may be formed to a substantially same depth as the first and second cell trenches 43 and 49. The peripheral circuit region P and the cell array region C may be etched using one semiconductor etching process or different semiconductor etching processes.

When one semiconductor etching process is used to etch both the peripheral circuit region P and the cell array region C, the cell array region C and the peripheral circuit region P of the semiconductor substrate 5 may be etched at the same rate using a selected etchant. This is because the isolation holes 104 of the cell array region C or the photoresist patterns of the peripheral circuit region P may have substantially equal opening areas.

Figure 8:
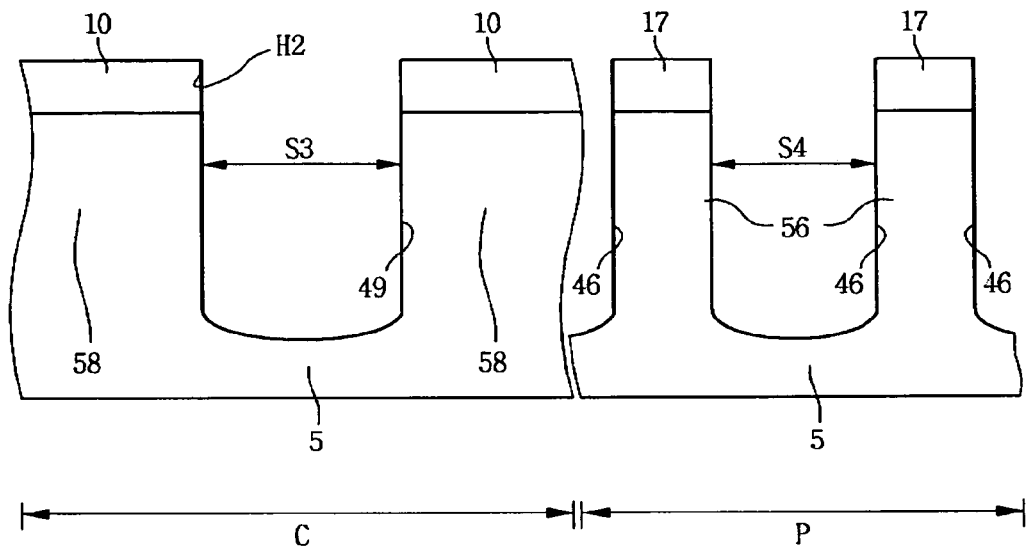
Figure 9:
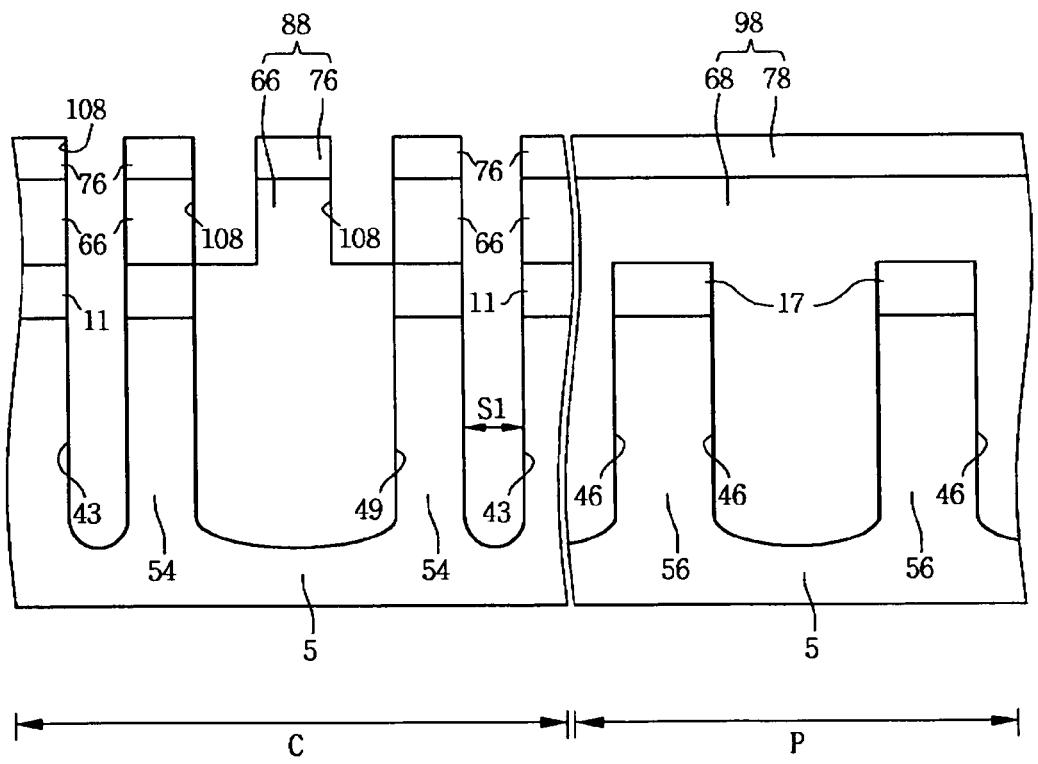

FIGS. 8 and 9 illustrate cross-sectional views taken along lines I-I' and II-II' of FIG. 1, which illustrate initial and intermediate steps of a method of forming an active region structure according to a third example embodiment.

Referring to FIG. 8, the semiconductor substrate 5 may be prepared. The semiconductor substrate 5 may have the cell array region C and the peripheral circuit region P. The pad layer 10 may be formed on the semiconductor substrate 5. The pad layer 10 may include a single material or a stacked material. The pad layer 10 may include a material having a different etch rate from the semiconductor substrate 5. A semiconductor photolithography process may be performed on the pad layer 10. The semiconductor photolithography process may include a coating step, an exposure step, and a development step.

During the performance of the semiconductor photolithography process, a photoresist layer may be formed on the pad layer 10 in the cell array region C. The photoresist layer may have through holes. The through holes may be formed in the same positions as the isolation holes 104 of FIG. 1. Each of the through holes may be substantially the same size as or a different size from a width S3 between selected active regions disposed opposite each other on both sides of one selected isolation hole 104. Thus, the through holes may expose the pad layer 10 as substantially equal areas in the cell array region C.

During the performance of the semiconductor photolithography process, photoresist patterns may be formed on the pad layer 10 in the peripheral circuit region P. The photoresist patterns may be formed a predetermined distance S4 apart from one another. During the performance of the semiconductor photolithography process, the photoresist layer of the cell array region C and the photoresist patterns of the peripheral circuit region P may or may not be formed simultaneously. When the photoresist layer and the photoresist patterns are not formed simultaneously, the semiconductor photolithography process may be completely covered with a protection layer, e.g., a selected photoresist layer, during the performance of the semiconductor photolithography process.

A semiconductor etching process may be performed on the pad layer 10 in the cell array region C using the photoresist layer as an etch mask. During the performance of the semiconductor etching process, the pad layer 10 and the semiconductor substrate 5, which are disposed within the through holes of the photoresist layer, may be etched at the same rate using an etchant. During the performance of the semiconductor etching process, openings H2 may be formed in the pad layer 10, while the second cell trenches 49 of FIG. 7 may be formed in the semiconductor substrate 5. The openings H2 and the second cell trenches 49 may be formed to correspond to the through holes. The second cell trenches 49 may define preliminary cell active regions 58.

In this case, each of the preliminary active regions 58 may be formed among four adjacent ones of the second cell trenches 49 of FIG. 1. The second cell trenches 49 may overlap the isolation holes 104, respectively. Two selected from the four adjacent second cell trenches 49 may be disposed on an extension line crossing between the remaining two of the four adjacent second cell trenches 49. Meanwhile, a semiconductor etching process may be performed in the peripheral circuit region P. During the performance of the semiconductor etching process, the pad layer 10 and the semiconductor substrate 5, which are disposed between the photoresist patterns of the peripheral circuit region P, may be etched using an etchant.

During the performance of the semiconductor etching process, peripheral pad patterns 17 and peripheral trenches 46 may be formed to correspond to the photoresist patterns. The peripheral trenches 46 may define peripheral active regions 56. After forming the second cell trenches 49 and the peripheral trenches 46, the photoresist layer and the photoresist patterns may be removed from the semiconductor substrate 5. The peripheral circuit region P and the cell array region C may be etched using one semiconductor etching process or different semiconductor etching processes.

When one semiconductor etching process is used, the cell array region C and the peripheral circuit region P of the semiconductor substrate 5 may be etched at the same rate using a selected etchant. This is because the through holes of the cell array region C or the photoresist patterns of the peripheral circuit region P may have substantially equal opening areas.

Referring to FIG. 9, a lower definition layer (not shown) and an upper definition layer (not shown) may be sequentially formed in the cell array region C and the peripheral circuit region P of FIG. 8. The lower definition layer or the upper definition layer may include carbon (C), a C-containing single material, and/or a C-containing stacked material. The lower definition layer may be formed on the pad layer 10 and the peripheral pad patterns 17 to fill the second cell trenches 49. A semiconductor photolithography process may be performed on the upper definition layer.

In this case, the upper definition layer may prevent diffused reflection of light during the performance of the semiconductor photolithography process. Photoresist patterns may be formed on the upper definition layer in the cell array region C during the performance of the semiconductor photolithography process. The photoresist patterns may be formed to expose the upper definition layer in the cell array region C. The photoresist patterns may correspond to the preliminary active regions 54 and A, or the cell active regions 54 and the isolation regions A of the cell array region C of FIG. 1. During the performance of the semiconductor photolithography process, a photoresist layer may be formed on the upper definition layer in the peripheral circuit region P.

During the performance of the semiconductor photolithography process, the photoresist patterns of the cell array region C and the photoresist layer of the peripheral circuit region P may or may not be formed simultaneously. When the photoresist patterns and the photoresist layer are not formed simultaneously, an unselected cell array region C or a peripheral circuit region P may be completely covered with a protection layer, e.g., a selected photoresist layer, during the performance of the semiconductor photolithography process. A semiconductor etching process may be performed on the lower and upper definition layers in the cell array region C using the photoresist patterns and the photoresist layer as an etch mask.

During the performance of the semiconductor etching process, the lower and upper definition layers disposed between the photoresist patterns in the cell array region C may be etched using an etchant until the pad layer 10 is exposed. Thus, isolation holes 108 may be formed in the lower and upper definition layers disposed between the photoresist patterns. The lower and upper definition layers may be patterned using the isolation holes 108 to be divided by cell lower definition patterns 66 and cell upper definition patterns 76 in the cell array region C, and peripheral lower and upper definition patterns 68 and 78 in the peripheral circuit region P. The cell lower definition patterns 66 and the cell upper definition patterns 76 may constitute cell definition patterns 88.

The peripheral lower and upper definition patterns 68 and 78 of the peripheral circuit region P may constitute peripheral definition patterns 98. The photoresist patterns and the photoresist layer may be removed during the performance of the semiconductor etching process along with the lower and upper definition layers disposed between the photoresist patterns. Subsequently, the semiconductor etching process may be performed on the pad layer 10 and the preliminary cell active regions 58 in the isolation holes 108 using the cell definition patterns 88 of the cell array region C and the peripheral definition patterns 98 of the peripheral circuit region P as an etch mask.

During the performance of the semiconductor etching process, the pad layer 10 disposed within the isolation holes 108 may be etched, thereby forming cell pad patterns 11 in the cell array region C. During the performance of the semiconductor etching process, the preliminary cell active regions 58 disposed within the isolation holes 108 may be etched, thereby forming the first cell trenches 43 of FIG. 4 or 6 in the cell array region C. The first and second cell trenches 43 and 49 may define cell active regions 54 under the cell pad patterns 11 in the cell array region C. The first and second cell trenches 43 and 49 may extend to substantially the same depth from a top surface of the semiconductor substrate 5 toward a lower portion thereof.

The peripheral trenches 46 may define peripheral active regions 56 under the peripheral pad patterns 17 in the peripheral circuit region P. The peripheral trenches 46 may be formed to substantially the same depth as the first and second cell trenches 43 and 49. Each of the first cell trenches 43 may be formed under a selected isolation hole 108 between two adjacent cell active regions 54. A width S1 of each of the first cell trenches 43 may be smaller than a width S3 of each of the second cell trenches 49 in a widthwise direction of the cell active regions 54.

Two adjacent first cell trenches 43 may overlap one selected second cell trench 49. The width S1 of each of the first cell trenches 43 may be substantially the same as or different from the width of each of the isolation holes 108 in the widthwise direction of the cell active regions 54. An etchant corresponding to the pad layer 10 and the preliminary cell active regions 58 may include the same material as or a different material from the etchant corresponding to the lower and upper definition layers.

Figure 10:
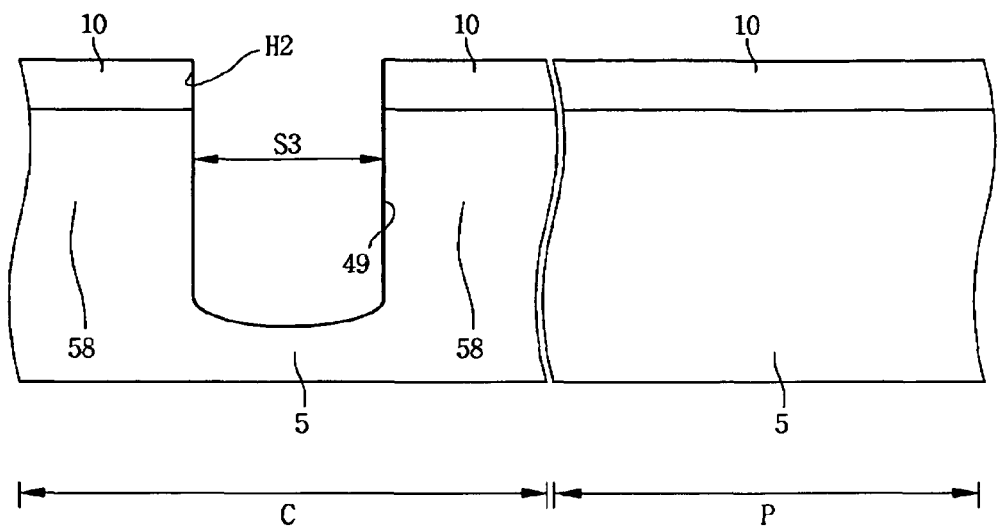
Figure 11:
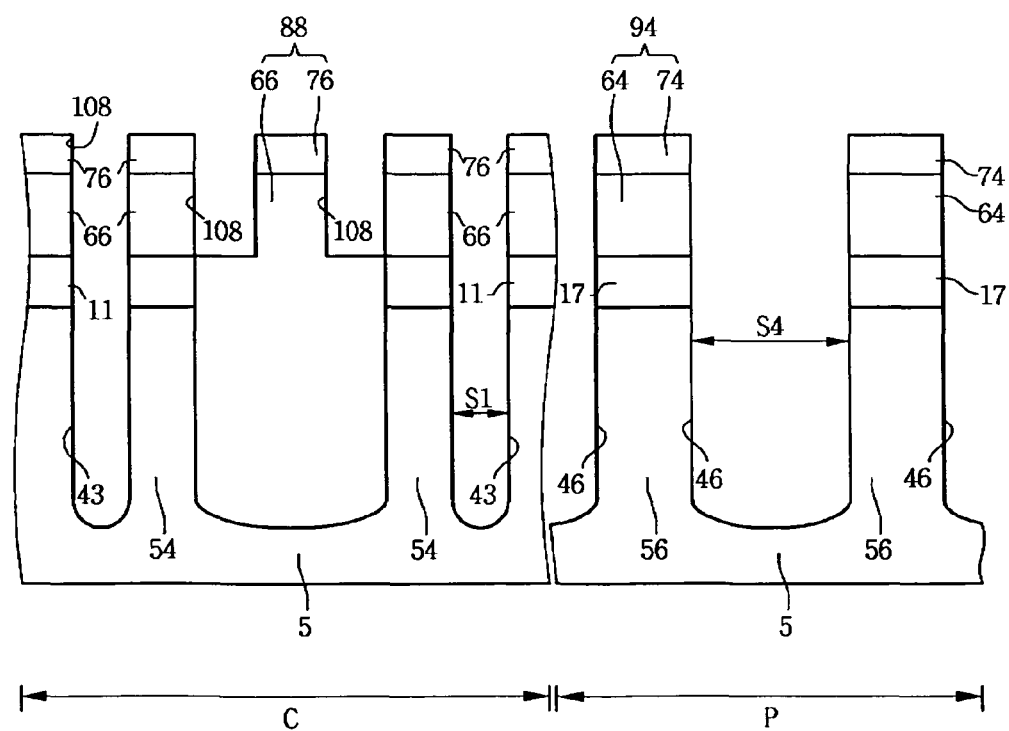

FIGS. 10 and 11 illustrate cross-sectional views taken along lines I-I' and II-II' of FIG. 1, which illustrate initial and intermediate steps of a method of forming an active region structure according to a fourth example embodiment.

Referring to FIG. 10, the semiconductor substrate 5 may be prepared. The semiconductor substrate 5 may include the cell array region C and the peripheral circuit region P. The pad layer 10 may be formed on the semiconductor substrate 5. The pad layer 10 may include a single material or a stacked material. The pad layer 10 may include a material having a different etch rate from the semiconductor substrate 5. A semiconductor photolithography process may be performed on the pad layer 10. The semiconductor photolithography process may include a coating step, an exposure step, and a development step.

During the performance of the semiconductor photolithography process, a photoresist layer may be formed on the pad layer 10 in the cell array region C and the peripheral circuit region P. The photoresist layer of the cell array region C may have through holes. The through holes may be formed in the same positions as the isolation holes 104 of FIG. 1. Each of the through holes may be substantially the same size as or a different size from a distance S3 between selected active regions disposed opposite each other on both sides of one selected isolation hole 104. Thus, the through holes may expose the pad layer 10 as substantially equal areas in the cell array region C.

During the performance of the semiconductor photolithography process, the photoresist layer of the cell array region C and the photoresist layer of the peripheral circuit region P may or may not be formed simultaneously. When the photoresist layers are not formed simultaneously, an unselected cell array region C or a peripheral circuit region P may be completely covered with a protection layer, e.g., a selected photoresist layer, during the performance of the semiconductor photolithography process. A semiconductor etching process may be performed on the pad layer 10 in the cell array region C using the photoresist layer as an etch mask. During the performance of the semiconductor etching process, the semiconductor substrate 5 and the pad layer 10, which are disposed within the through holes of the photoresist layer in the cell array region C, may be etched at the same rate using an etchant. During the performance of the semiconductor etching process, the openings H2 may be formed in the pad layer 10, while the second cell trenches 49 of FIG. 7 may be formed in the semiconductor substrate 5. The openings H2 and the second cell trenches 49 may be formed to correspond to the through holes. The second cell trenches 49 may define preliminary cell active regions 58. In this case, each of the preliminary active regions 58 may be formed among four adjacent ones of the second cell trenches 49 of FIG. 1. The second cell trenches 49 may overlap the isolation holes 104 of FIG. 1, respectively.

Two selected from the four adjacent second cell trenches 49 may be disposed on an extension line crossing between the remaining two of the four adjacent second cell trenches 49. After forming the second cell trenches 49, the photoresist layer may be removed from the semiconductor substrate 5.

Referring to FIG. 11, a lower definition layer (not shown) and an upper definition layer (not shown) may be sequentially formed in the cell array region C and the peripheral circuit region P of FIG. 10. The lower definition layer or the upper definition layer may include carbon (C), a C-containing single material, and/or C-containing stacked material. The lower definition layer may be formed on the pad layer 10 to fill the second cell trenches 49. A semiconductor photolithography process may be performed on the upper definition layer. In this case, the upper definition layer may prevent diffused reflection of light during the performance of the semiconductor photolithography process.

During the performance of the semiconductor photolithography process, photoresist patterns may be formed on the upper definition layer in the cell array region C and the peripheral circuit region P. The photoresist patterns may be formed to expose the upper definition layer in the cell array region C and the peripheral circuit region P. The photoresist patterns of the cell array region C may correspond to the photoresist patterns of the cell array region C of FIG. 9. The photoresist patterns of the peripheral circuit region P may correspond to the photoresist patterns of the peripheral circuit region P of FIG. 7.

During the performance of the semiconductor photolithography process, the photoresist patterns of the cell array region C and the photoresist patterns of the peripheral circuit region P may or may not be formed simultaneously. When the photoresist patterns are not formed simultaneously, an unselected cell array region C or a peripheral circuit region P may be completely covered with a protection layer, e.g., a selected photoresist layer, during the performance of the semiconductor photolithography process. A semiconductor etching process may be performed on the lower and upper definition layers in the cell array region C using the photoresist patterns as an etch mask.

During the performance of the semiconductor etching process, the lower and upper definition layers formed between the photoresist patterns of the cell array region C may be etched using an etchant until the pad layer 10 is exposed. Thus, isolation holes 108 may be formed in the lower and upper definition layers between the photoresist patterns of the cell array region C. The lower and upper definition layers of the cell array region C may be patterned using the isolation holes 108, thereby forming cell lower definition patterns 66 and cell upper definition patterns 76. The cell lower definition patterns 66 and the cell upper definition patterns 76 may constitute cell definition patterns 88.

Subsequently, the semiconductor etching process may be performed on the pad layer 10 and the preliminary cell active regions 58, which are disposed within the isolation holes 108, using the cell definition patterns 88 of the cell array region C as an etch mask. During the performance of the semiconductor etching process, the pad layer 10 disposed within the isolation holes 108 may be etched, thereby forming cell pad patterns 11 in the cell array region C. During the performance of the semiconductor etching process, the preliminary active regions 58 disposed within the isolation holes 108 may be etched, thereby forming the first cell trenches 43 of FIG. 4 or 6.

Meanwhile, a semiconductor etching process may be performed on the peripheral circuit region P. During the performance of the semiconductor etching process, the lower and upper definition layers disposed adjacent to the photoresist patterns of the peripheral circuit region P may be etched using an etchant until the pad layer 10 is exposed. As a result, the lower and upper definition layers of the peripheral circuit region P may be patterned to be divided by lower definition peripheral patterns 64 and upper definition peripheral patterns 74. The lower definition peripheral patterns 64 and the upper definition peripheral patterns 74 may constitute peripheral definition patterns 94.

The semiconductor etching process may be performed on the semiconductor substrate 5 and the pad layer 10, which are disposed adjacent to the peripheral definition patterns 94, using the peripheral definition patterns 94 of the peripheral circuit region P as an etch mask. During the performance of the semiconductor etching process, the pad layer 10 disposed adjacent to the peripheral definition patterns 94 may be etched, thereby forming the peripheral pad patterns 17. During the performance of the semiconductor etching process, the semiconductor substrate 5 disposed adjacent to the peripheral definition patterns 94 may be etched, thereby forming the peripheral trenches 46. The photoresist patterns of the cell array region C and the peripheral circuit region P may be removed during the performance of the semiconductor etching process along with the lower and upper definition layers interposed between the photoresist patterns.

The first and second cell trenches 43 and 49 may define the cell active regions 54 under the cell pad patterns 11 of the cell array region C. The first and second cell trenches 43 and 49 may extend to substantially the same depth from a top surface of the semiconductor substrate 5 toward a lower portion thereof. The peripheral trenches 46 may define peripheral active regions 56 under the peripheral pad patterns 17 of the peripheral circuit region P. The peripheral trenches 46 may be formed to substantially the same depth as the first and second cell trenches 43 and 49. Each of the first cell trenches 43 may be formed under one selected isolation hole 108 between two adjacent cell active regions 54.

The width S1 of each of the first cell trenches 43 may be smaller than the width S3 of each of the second cell trenches 49 in a widthwise direction of the cell active regions 54. Two adjacent first cell trenches 43 may overlap one selected second cell trench 49. The width S1 of each of the first cell trenches 43 may be substantially the same as or different from the width of each of the isolation holes 108 in the widthwise direction of the cell active regions 54.

The peripheral circuit region P and the cell array region C may be etched using one semiconductor etching process or different semiconductor etching processes. When one semiconductor etching process is used, the cell array region C and the peripheral circuit region P of the semiconductor substrate 5 may be etched at the same rate using a selected etchant. This is because the photoresist patterns of the cell array region C or the peripheral circuit region P may have substantially equal opening areas.

Figure 12:
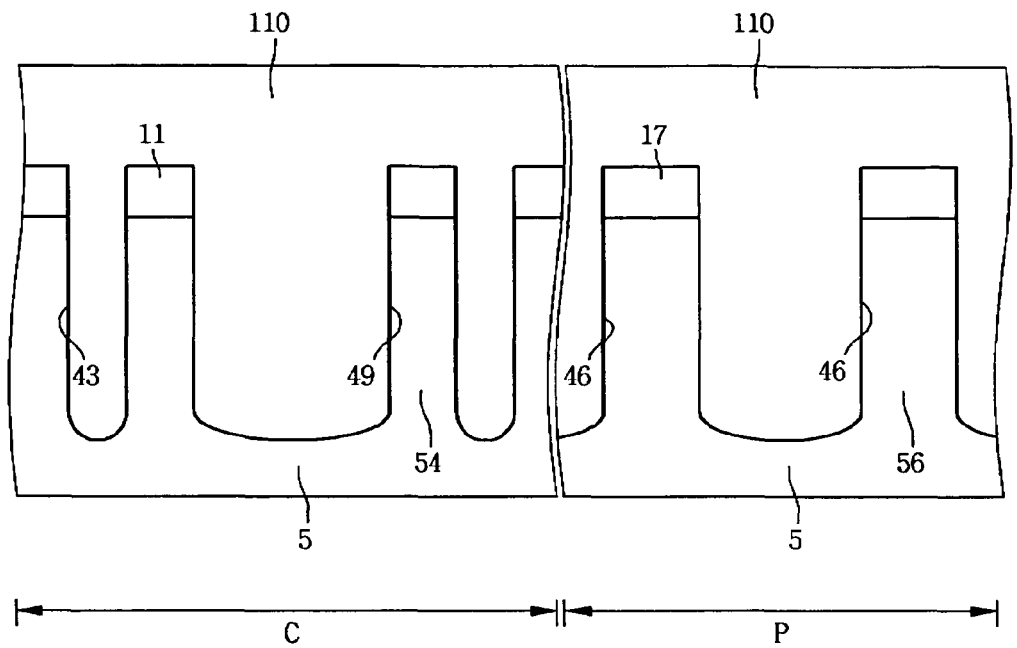
Figure 13:
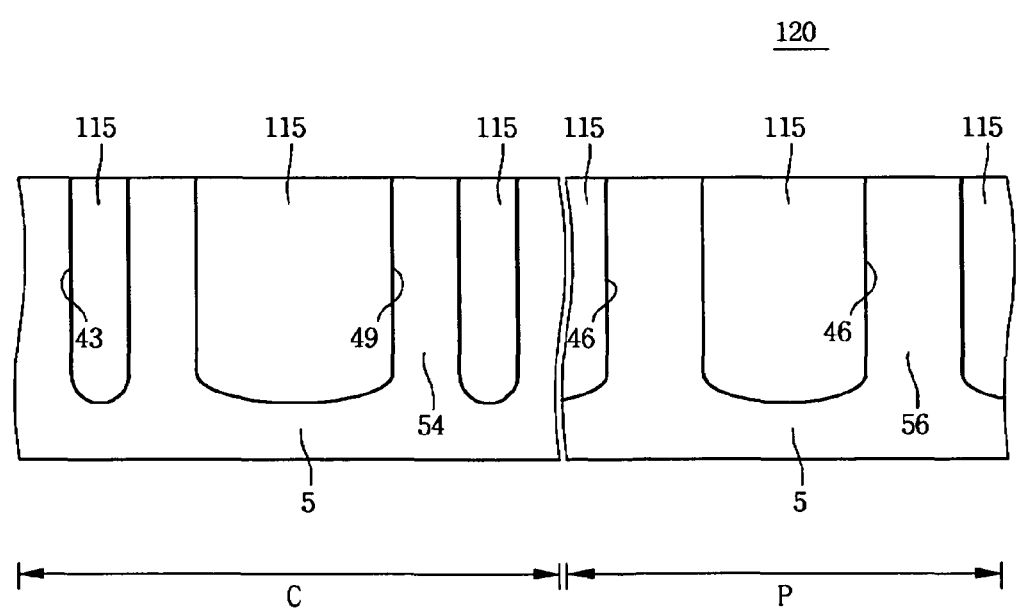

FIGS. 12 and 13 illustrate cross-sectional views taken along lines I-I' and II-II' of FIG. 1, which illustrate a final step of a method of forming an active region structure according to the first through fourth example embodiments.

Referring to FIG. 12, after forming the first and second cell trenches 43 and 49 and the peripheral trenches 46 of FIGS. 7, 9, and 11, the cell definition patterns 84 and 88 and the peripheral definition patterns 94 and 98 may be removed from the semiconductor substrate 5. Subsequently, an insulating layer 110 may be formed in the cell array region C and the peripheral circuit region P. The insulating layer 110 may be formed to fill the first and second cell trenches 43 and 49 and the peripheral trenches 46 and cover the cell pad patterns 11 and the peripheral pad patterns 17. The insulating layer 110 may include one of a single material and a stacked material. The insulating layer 110 may have the same etch rate as or a different etch rate from the semiconductor substrate 5.

Referring to FIG. 13, a semiconductor etching process may be performed on the cell pad patterns 11, the peripheral pad patterns 17, and the insulating layer 110. The semiconductor etching process may be performed using a chemical mechanical polishing (CMP) or an etchback technique. During the performance of the semiconductor etching process, the insulating layer 110 of the cell array region C and the peripheral circuit region P may be etched at the same rate using an etchant. During performing a first step of the semiconductor etching process, the insulating layer 110 may be etched to expose the cell pad patterns 11 and the peripheral pad patterns 17.

Thereafter, during performing a second step of the semiconductor etching process, the cell pad patterns 11, the peripheral pad patterns 17, and the insulating layer 110 may be etched until the cell active regions 54 and the peripheral active regions 56 are exposed. Thus, the insulating layer 110 may be etched to form an isolation layer 115. The isolation layer 115 may be formed to sufficiently fill the first and second cell trenches 43 and 49 and the peripheral trenches 46. The isolation layer 115 may constitute an active region structure 120 along with the cell active regions 54 of the cell array region C and the peripheral active regions 56 of the peripheral circuit region P.

As described above, example embodiments provide a method of forming an active region structure, which minimizes light interference during the performance of a semiconductor photolithography process and allows etch rates of an etchant to be substantially the same during the performance of a semiconductor etching process. To do this, a semiconductor photolithography process according to the example embodiments may allow partially exposed areas of a cell array region and/or a peripheral circuit region to be the same using through holes of a photoresist layer or photoresist patterns.

A semiconductor etching process according to the example embodiments may be performed on the cell array region and/or the peripheral circuit region at the same etch rate using the through holes of the photoresist layer or the photoresist patterns as an etch mask. Thus, the example embodiments can provide a method of forming an active region structure without affecting the pattern density of the cell array region and/or the peripheral circuit region. As a result, active regions protruding from a semiconductor substrate can be stably formed in the cell array region and/or the peripheral circuit region.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of forming an active region structure, comprising:
    preparing a semiconductor substrate including a cell array region and a peripheral circuit region;
    forming preliminary cell active regions in the cell array region of the semiconductor substrate; and
    forming cell active regions in the preliminary cell active regions and at least one peripheral active region in the peripheral circuit region of the semiconductor substrate, such that the preliminary cell active regions, the active regions, and the at least one peripheral active region are integrally formed with the semiconductor substrate and protrude from the semiconductor substrate,
    wherein forming the preliminary cell active regions includes:
        forming a pad layer to cover an entire surface of the semiconductor substrate;
        forming first buffer patterns and a buffer layer on the pad layer in the cell array region and the peripheral circuit region of the semiconductor substrate, respectively;
        forming sacrificial patterns between the first buffer patterns;
        forming second buffer patterns in the sacrificial patterns, respectively, the first and second buffer patterns having a line shape and corresponding to the preliminary cell active regions; and
        forming first cell trenches in the cell array region of the semiconductor substrate to correspond to the sacrificial patterns.

2. The method as claimed in claim 1, wherein forming the first cell trenches includes:
    etching the sacrificial patterns and the pad layer disposed under the sacrificial patterns using the first and second buffer patterns and the buffer layer as an etch mask to expose the semiconductor substrate, such that the pad layer is divided into cell pad patterns in the cell array region; and
    etching the first and second buffer patterns, the buffer layer, and the semiconductor substrate using the cell pad patterns of the cell array region and the pad layer of the peripheral circuit region as an etch mask, such that the first and second buffer patterns and the buffer layer are removed from the cell pad patterns and the pad layer.

3. The method as claimed in claim 2, wherein forming the cell active regions and the at least one peripheral active region includes:
    forming a cell definition pattern and a peripheral definition pattern on the cell pad patterns of the cell array region and the pad layer of the peripheral circuit region, respectively, to fill the first cell trenches, the cell definition pattern having isolation holes on the cell pad patterns, and the peripheral definition pattern defining the at least one peripheral active region;
    etching the cell pad patterns disposed within the isolation holes and the pad layer disposed adjacent to the peripheral definition pattern using the cell definition pattern and the peripheral definition pattern as an etch mask, such that the pad layer of the peripheral circuit region is patterned to form at least one peripheral pad pattern;
    etching the preliminary active regions disposed within the isolation holes and the semiconductor substrate disposed adjacent to the peripheral definition pattern using the cell definition pattern, the peripheral definition pattern, and the at least one peripheral pad pattern as an etch mask to form second cell trenches in the cell array region and peripheral trenches in the peripheral circuit region; and
    removing the cell definition pattern and the peripheral definition pattern from the semiconductor substrate.

4. The method as claimed in claim 3, wherein the first and second cell trenches define the cell active regions under the cell pad patterns of the cell array region and extend to substantially the same depth from a top surface to a bottom surface of the semiconductor substrate, and the peripheral trenches define the at least one peripheral active region under the at least one peripheral pad pattern of the peripheral circuit region and are formed to substantially the same depth as the first and second cell trenches.

5. The method as claimed in claim 4, wherein each of the second cell trenches is formed between selected cell active regions disposed opposite each other on both sides of one selected isolation hole in a widthwise direction of the first and second buffer patterns, and a width of each of the first cell trenches is smaller than a width of each of the second cell trenches in the widthwise direction of the first and second buffer patterns.

6. The method as claimed in claim 5, wherein two adjacent first cell trenches overlap one selected second cell trench, the width of each of the first cell trenches is substantially the same as or different from a width of each of the isolation holes in the widthwise direction of the first and second buffer patterns, and each of the isolation holes is defined by an opening area of the one selected second cell trench.

7. The method as claimed in claim 6, wherein the cell and peripheral definition patterns are formed of carbon (C), a C-containing single material, or a C-containing stacked material.

8. A method of forming an active region structure, comprising:
   preparing a semiconductor substrate including a cell array region and a peripheral circuit region;
   forming preliminary cell active regions in the cell array region of the semiconductor substrate; and
   forming cell active regions in the preliminary cell active regions and at least one peripheral active region in the peripheral circuit region of the semiconductor substrate, such that the preliminary cell active regions, the active regions, and the at least one peripheral active region are integrally formed with the semiconductor substrate and protrude from the semiconductor substrate,
   wherein forming the preliminary cell active regions includes:
      forming a pad layer to cover an entire surface of the semiconductor substrate;
      forming first cell pad patterns on the cell array region of the semiconductor substrate, the first cell pad patterns having a line shape;
      dividing the first cell pad patterns into second cell pad patterns, the second cell pad patterns having a line shape and corresponding to the preliminary cell active regions; and
      etching the semiconductor substrate of the cell array region using the second cell pad patterns and the pad layer of the peripheral circuit region as an etch mask to form first cell trenches in the semiconductor substrate, such that the second cell pad patterns and the pad layer of the peripheral circuit region are partially etched.

9. The method as claimed in claim 8, wherein forming the cell active regions and the at least one peripheral active region includes:
   forming a cell definition pattern on the second cell pad patterns in the cell array region to fill the first cell trenches, such that the cell definition pattern has isolation holes formed on the second cell pad patterns;
   forming a peripheral definition pattern on the pad layer in the peripheral circuit region, such that the peripheral definition pattern defines the at least one peripheral active region;
   etching the second cell pad patterns disposed in the isolation holes and the pad layer disposed adjacent to the peripheral definition pattern using the cell definition pattern and the peripheral definition pattern as an etch mask, such that the pad layer of the peripheral circuit region is patterned to form at least one peripheral pad pattern;
   etching the preliminary active regions disposed in the isolation holes and the semiconductor substrate disposed adjacent to the peripheral definition pattern using the cell definition pattern, the peripheral definition pattern, and the at least one peripheral pad pattern as an etch mask to form second cell trenches in the cell array region and peripheral trenches in the peripheral circuit region; and
   removing the cell definition pattern and the peripheral definition pattern from the semiconductor substrate.

* * * * *